United States Patent [19]

Hartman et al.

[11] 4,349,751

[45] Sep. 14, 1982

[54] CONTROL CIRCUITRY USING A PULL-DOWN TRANSISTOR FOR HIGH VOLTAGE SOLID-STATE SWITCHES

[75] Inventors: Adrian R. Hartman, New Providence; Peter W. Shackle, Bridgewater, both of N.J.

[73] Assignee: Bell Telephone Laboratories, Incorporated, Murray Hill, N.J.

[21] Appl. No.: 120,282

[22] Filed: Feb. 11, 1980

[51] Int. Cl.³ .............................................. H03K 17/60
[52] U.S. Cl. .............................. 307/252 A; 307/252 C; 307/318; 307/566; 307/305; 331/108 R; 331/115; 357/22; 357/38; 357/58
[58] Field of Search ............... 307/252 A, 252 C, 318, 307/566, 299, 304, 305; 331/108 R, 115; 357/22, 38, 58

[56] References Cited

U.S. PATENT DOCUMENTS

| | | | |
|---|---|---|---|
| 3,474,352 | 10/1969 | Merrell | 331/108 R |
| 3,676,877 | 7/1972 | Kobayashi | 307/318 |
| 4,117,351 | 9/1978 | Kalfus et al. | 307/252 C |
| 4,250,409 | 2/1981 | Davis et al. | 307/305 |

FOREIGN PATENT DOCUMENTS 2452107  6/1976  Fed. Rep. of Germany ...... 307/318

Primary Examiner—Joseph E. Clawson, Jr.
Attorney, Agent, or Firm—Irwin Ostroff

[57] ABSTRACT

To switch a first gated diode switch (GDS1) to the "OFF" state requires a voltage applied to the gate which is more positive than that of the anode or cathode and a sourcing of current into the gate of substantially the same order of magnitude as flows between the anode and cathode of the first switch. Control circuitry, which uses a second gated diode switch (GDSC) coupled by the cathode to the gate of the first switch (GDS1), is used to control the state of the first switch (GDS1). The control circuitry comprises a first branch circuit coupled to the gate of GDSC and to a first potential source +V1 and a second branch circuit coupled to the anode of GDSC and to a second potential source V2. The first branch circuit is connected to the gate of the second switch (GDSC) and controls the state thereof. The second branch circuit helps switch the first switch to the OFF state by providing a single current pulse or a plurality of current pulses into the gate of the first switch.

3 Claims, 3 Drawing Figures

CONTROL CIRCUITRY USING A PULL-DOWN TRANSISTOR FOR HIGH VOLTAGE SOLID-STATE SWITCHES

TECHNICAL FIELD

This invention relates to control circuitry for controlling the state of solid-state switches, and in particular, to control circuitry for controlling the state of solid-state switches which have high voltage and relatively high current capabilities.

BACKGROUND OF THE INVENTION

High voltage and relatively high current capability solid-state switches, such as one described in an article entitled "A Field Terminated Diode" by Douglas E. Houston et al, published in *IEEE Transactions on Electron Devices*, Vol. ED-23, No. 8, August, 1976, and those discussed in pending U.S. patent applications Ser. Nos. 972,056 abandoned (A. B. Hartman, T. J. Riley, P. W. Shackle, 972,921 abandoned (A. R. Hartman, A. U. Mac Rae, P. W. Shackle, 972,022 abandoned (J. E. Berthold, A. R. Hartman, T. J. Riley, P. W. Shackle), and 971,886 abandoned (A. R. Hartman, B. T. Murphy, T. J. Riley, P. W. Shackle, all filed Dec. 20, 1978, and having a common assignee with the the present application and U. S. patent applications Ser. Nos. 107,774 (A. R. Hartman, T. J. Riley, P. W. Shackle), 107,773 (A. R. Hartman, B. T. Murphy, T. J. Riley, P. W. Shackle), 107,772 (A. R. Hartman, A. U. Mac Rae, P. W. Shackle), 107,780 (J. E. Berthold, A. R. Hartman, T. J. Riley, P. W. Shackle), and 107,775 (A. R. Hartman, T. J. Riley, P. W. Shackle), filed Dec. 28, 1979, and having a common assignee with the present application, have an ON (conducting) state and an OFF (blocking) state. These switches are capable of blocking relatively large potential differences in the OFF state. Each of these switches has two output terminals which are generally denoted as the anode and cathode, a control terminal which is generally denoted as the gate, and a semiconductor body whose bulk separates the anode, cathode, and gate regions. The parameters of the various portions of the semiconductor are such that with the potential of the anode region being greater than that of the cathode region and the potential of the gate region being insufficient to cause the potential of a vertical cross-sectional portion of the bulk of the semiconductor body between the anode and cathode to be greater in potential than the anode or cathode regions there is facilitated a substantial current flow between the anode and cathode regions via the bulk. With the potential of the gate region being sufficiently more positive than that the anode and cathode regions to cause a vertical cross-sectional portion of the bulk of the semiconductor body between the anode and cathode regions to be more positive in potential than the anode and cathode regions there is facilitated an interrupting or inhibiting of current flow between the anode and cathode regions. The magnitude of the needed gate potential necessary to turn off these switches is a function of the geometry and doping levels of the semiconductor regions of each switch and of the anode and cathode potentials.

Control circuitry used to apply a blocking voltage to the gate terminal of each of these switches must be able to sustain a more positive voltage than is at the anode and cathode terminals and must be able to supply current which is generally of the same magnitude as flows through the anode and cathode of each switch.

Pending U.S. patent applications Ser. Nos. 972,023 (A. R. Hartman, T. J. Riley, P.W. Shackle) and 972,024 abandoned (P. W. Shackle), which were both filed Dec. 20, 1978, and have a common assignee with the present application, describe and illustrate control circuitry which itself uses a high voltage and current switch of the type described hereinabove to control the state of a similar switch. If the control circuitry should fail to break (interrupt) current flow through an ON switch connected thereto, it is necessary to electrically disconnect the control circuit from one of the supply potential sources. The control circuitry is then reset and reconnected to the potential source. It is then activated again so as to break conduction through the ON switch.

Usually a conventional high voltage and high current capability switch is used between the high voltage source and the control circuitry. This switch can be an optically activated switch. Generally it is a relatively expensive component and only one is used for a relatively large number of control circuits. If any of the switches to be controlled fails to turn off, it is necessary to disconnect all the control circuits from the power supply. This may result in all of the switches connected to the control circuitries being switched to the ON state independent of which state is desired. This is undesirable in some switching applications.

It is desirable to have circuitry capable of controlling high voltage and high current solid-state switches of the type discussed hereinabove which does not require disconnection from the power supply (potential source) and which automatically and repeatedly attempts to turn off and break conduction through a load switch.

SUMMARY OF THE INVENTION

The present invention is directed to control circuitry (300) for controlling the state of high voltage and relatively high current load solid-state switch(es) (GDS1) of the type described hereinabove. The control circuitry essentially comprises a control switch (GDSC), which in a preferred embodiment is a gated diode switch, a first branch circuit (310A) coupled to the gate of GDSC and to a first potential source (+V1), and a second branch circuit (310B) coupled to the anode of GDSC and to a second potential source (+V2).

In one typical embodiment the control switch (GDSC) is coupled by an output terminal (typically the cathode) to the gate terminal of a load switch (GDS1) whose state is to be controlled. The load switch is also typically a gated diode switch. The first branch circuit typically comprises an n-p-n transistor, three p-n diodes, and two current limiter circuits which are typically pinch resistors. The second branch circuit typically comprises two gated diode switches of the type described hereinabove, two zener diodes, and three current limiter circuits which are typically pinch resistors, three resistors, and an n-p-n transistor.

The state of GDSC is controlled essentially by the first voltage branch circuit (310A) which selectively adjusts the gate voltage. The first voltage branch circuit has high voltage capability but only a modest current supply capability. Thus, any current flowing through GDSC must be only of a modest value for the first branch circuit to be capable of switching GDSC from the ON to the OFF state.

The second branch circuit configuration is characterized in that it limits current flow therethrough to a maximum value. Once the maximum value is reached the second branch circuit automatically reduces the current flow therethrough to a significantly lower level. If one of the load switches sticks in the ON and conducting state, the second branch continually provides a train of current pulses until the load switch stops conducting and is switched to the OFF state. This reduces the current supply requirements of +V2 and thus helps lower costs and helps to insure that the potential level of +V2 stays at a level which is sufficient to maintain all the load switches (GDSLs) coupled thereto in the desired state.

The second branch circuit serves to help interrupt conduction through a load switch (GDS1) and thereby sets it to an OFF state independent of the potentials of the anode and cathode thereof so long as these potentials are within preselected limits. It is characterized in that it generates repeated current pulses to switch OFF a load switch which is stuck in an ON state and is conducting.

These and other features and advantages of the invention are better understood from a consideration of the following detailed description taken in conjunction with the accompanying drawing.

DETAILED DESCRIPTION

Figure 1:
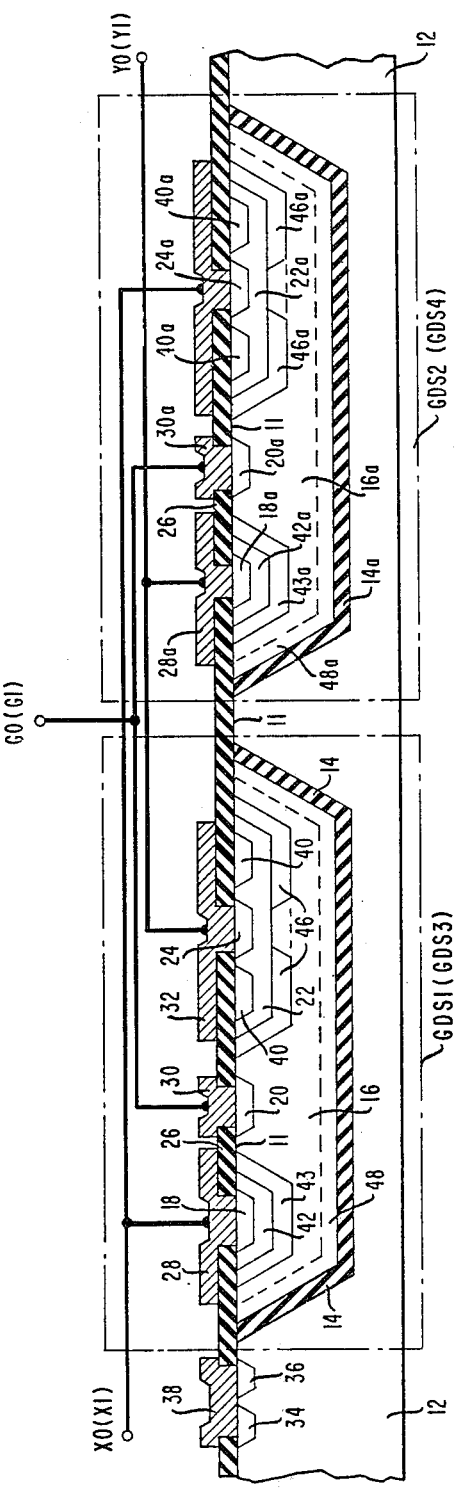
FIG. 1 illustrates two interconnected solid-state structures on a common semiconductor body (substrate)

Referring now to FIG. 1, there is illustrated a semiconductor structure 10 comprising gated diode switches GDS1 (GDS3) and GDS2 (GDS4) which are illustrated within dashed line rectangles and are both formed on a common support member 12. This basic gated diode switch structure is disclosed and described in U.S. patent application Ser. No. 107,774 (A. R. Hartman et al).

Support member 12 is typically a semiconductor wafer or a substrate. Dielectric layers 14 and 14a separate monocrystalline semiconductor bodies 16 and 16a, respectively, from support member 12 and from each other. Support member 12 has a major surface 11 and bodies 16 and 16a each have a portion that is common with surface 11. Whereas only two gated diode switches are illustrated, a plurality of dielectrically isolated gated diode switches of the type of GDS1 and/or GDS2 can be formed in a common semiconductor wafer or substrate 12.

GDS1 and GDS2 are illustrated having electrical connections therebetween which facilitate the use thereof as a bidirectional high voltage switch. GDS1 and GDS2 need not be electrically connected and each can function independently of the other.

In one typical embodiment, support member 12 is a semiconductor wafer (substrate) of n or p type conductivity and semiconductor bodies 16 and 16a have bulk portions thereof which are of p− type conductivity. The semiconductor regions contained within semiconductor body 16 are very similar to those contained in body 16a. A localized anode region 18, which is typically of p+ type conductivity, is included in body 16 and has a portion thereof that extends to surface 11. Surrounding anode region 18 is a p type region 42 which also has a portion thereof which extends to surface 11. Surrounding region 42 is a p− type region 43 which also has a portion thereof which extends to surface 11. The conductivity of region 42 is intermediate between that of anode region 18 and semiconductor body 16. The conductivity of region 43 is intermediate between that of region 42 and semiconductor body 16. Electrode 28 is illustrated making contact to region 18. Electrode 28 is separated from portions of surface 11 other than those over the exposed portion of region 18 by dielectric layer 26. A localized gate region 20 of n+ type conductivity is included in body 16 and has a portion thereof which extends to surface 11 and is separated from region 42 by portions of the bulk of semiconductor body 16. An electrode 30 contacts region 20 at surface 11. Electrode 30 is separated from portions of surface 11 other than those over the exposed portion of region 20 by dielectric layer 26. A localized cathode region 24, which is of n+ type conductivity, is included in body 16 and is separated from region 20 by portions of the bulk of semiconductor body 16. Region 24 is encircled by a p+ type guard ring 40 which, in turn, is encircled by a p type region 22 which, in turn, is encircled by a guard ring like p type region 46. Region 46 can extend, as is illustrated by the dashed line, to essentially completely surround region 22, except for the portions thereof common to surface 11. Region 46 is separated from regions 20 and 43 by portions of the bulk of semiconductor body 16. Electrode 32 contacts region 24. Electrode 32 is separated from portions of surface 11 other than over the respective exposed portion of region 24. A layer 48 of n− type conductivity exists between the dielectric layer 14 and semiconductor body 16. Layer 48, which is part of a preferred embodiment, is shown in dashed line since it is optional. Gate region 20 also serves as the collector of a lateral n-p-n transistor with cathode region 24 serving as the emitter and regions 46, 22, and 40 serving as the base. Contact regions 34 and 36, which are of p+ type and n+ type conductivity, respectively, exist within substrate 12 and extend to surface 11. Electrode 38 makes electrical contact to regions 34 and 36.

Semiconductor body 16a contains regions which are very similar to those contained within semiconductor body 16.

GDS1 is typically operated as a switch which is characterized by a low impedance between anode region 18 and cathode region 24 when in the ON (conducting) state and as a high impedance between said two regions when in the OFF (nonconducting) state. With operating potentials applied to anode region 18 and cathode region 24, the potential applied to gate region 20 determines the state of the switch. Conduction between anode region 18 and cathode region 24 can occur if the potential of the gate region 20 is near or below the potential of the anode region 18, cathode region 24, and regions 22, 40, and 46. During the ON state holes are injected into body 16 from anode region 18 and electrons are injected into body 16 from cathode region 24. This effectively lowers the resistance of body 16 such that the resistance between anode region 18 and cathode region 24 is relatively low when GDS1 is operating in the ON state. This type of operation is denoted as dual carrier injection and the type of structure described therein has been denoted as a gated diode switch (GDS). Guard ring region 40 and regions 22 and 46 help limit the punch-through of a depletion layer formed during operation between gate region 20 and cathode region 24 and help to inhibit the formation of a surface inversion layer between these two regions. In addition, they facilitate gate region 20 and cathode region 24 being relatively closely spaced apart. This facilitates relatively low resistance between anode region 18 and cathode region 22 during the ON state.

Substrate 12 is typically held at the most positive potential level available. Conduction between anode region 18 and cathode region 24 is inhibited or cut off if the potential of gate region 20 is sufficiently more positive than that of anode region 18 and cathode region 24. The amount of excess positive potential needed to inhibit or cut off conduction is a function of the geometry and impurity concentration (doping) levels of GDS1. This positive gate potential causes a portion of body 16 between gate region 20 and the portion of dielectric layer 14 therebelow to be at a potential that is more positive than that of anode region 18, cathode region 24, and region 22. This positive potential barrier inhibits the conduction of holes from anode region 18 to cathode region 24. It essentially pinches off body 16 against dielectric layer 14 in the bulk portion of semiconductor body 16 below gate region 20 and extending down to dielectric layer 14. It also serves to collect electrons emitted at cathode region 24 before they can reach anode region 18. Examples of control circuitry capable of supplying the needed gate potentials and absorbing the electrons are illustrated and described in copending U.S. patent applications Ser. Nos. 972,023 and 972,024, which were both filed on Dec. 20, 1978, and have a common assignee with the present application. Other control circuitry in accordance with the present invention for controlling gated diode switches like GDS1 (GDS3) and/or GDS2 (GDS4) is illustrated and described in FIG. 3 herein.

Figure 3:
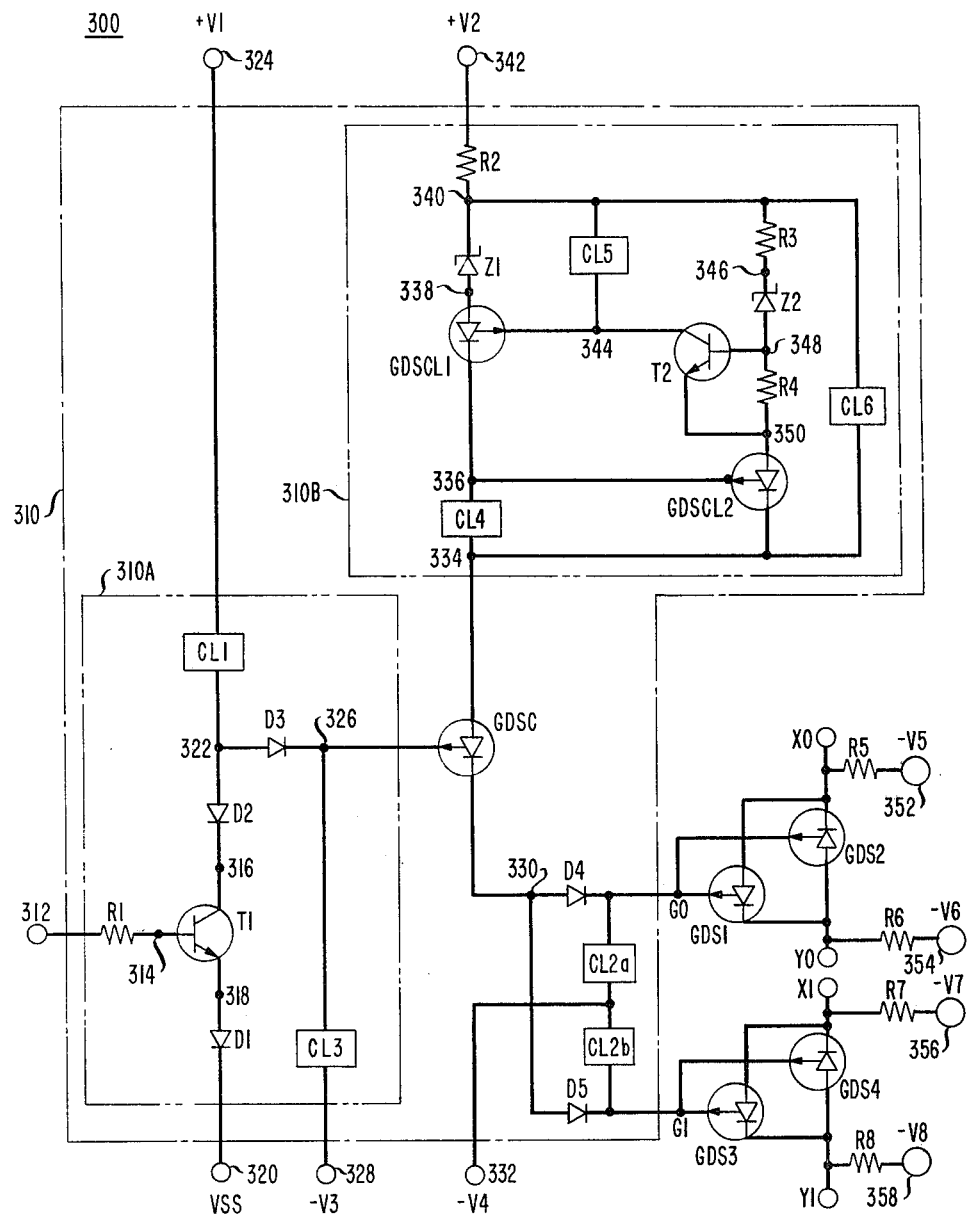
FIG. 3 illustrates a switching system in accordance with one embodiment of the present invention.

The electrical connections shown between electrodes 28 and 32a to a terminal X0 (X1), electrodes 30 and 30a to a terminal G0 (G1), and electrodes 32 and 28a to terminal Y0 (Y1), couple GDS1 (GDS3) and GDS2 (GDS4) together so as to form a bidirectional switching element whose equivalent circuit is illustrated in FIG. 3 herein.

One embodiment of structure 10 has been fabricated with 16 dielectrically separated switches on a single nominally undoped silicon support member (substrate) 12 which is 19 to 21 mils thick. Dielectric layer 14 is a silicon dioxide layer that is 3 to 4 microns thick. Body 16 is typically 44 to 54 microns thick, approximately 420 microns long, 300 microns wide, and is of p type conductivity with an impurity concentration in the range of approximately $5-9 \times 10^{13}$ impurities/cm$^3$. Layer 48, when it exists, is of n type conductivity with an impurity concentration in the range of $5 \times 10^{13}$ to $9 \times 10^{14}$ impurities/cm$^3$ and a thickness of approximately 12 microns. Anode region 18 is p+ type conductivity and is typically 2 to 4 microns thick, 24 microns wide, 145 microns long, and has an impurity concentration of approximately $10^{19}$ impurities/cm$^3$. Region 42 is of p type conductivity, is typically 3-4 microns thick, 31 microns wide, 152 microns long, and has an impurity concentration of approximately $10^{18}$ impurities/cm$^3$. Region 43 is of p type conductivity, is typically 15 microns thick, 90 microns wide, 211 microns long, and has an impurity concentration of approximately $10^{16}$ impurities/cm$^3$. Electrode 28 is typically aluminum, with a thickness of 1½ microns, a width of 74 microns and a length of 195 microns. Gate region 20 is of n+ type conductivity and is typically 15 microns thick, 40 microns wide, 300 microns long, and has an impurity concentration of approximately $5 \times 10^{19}$ impurities/cm$^3$. Region 36 is of p+ type conductivity and is typically 2 microns thick, 15 microns wide, 15 microns long, and has an impurity concentration of approximately $10^{19}$ impurities/cm$^3$. Electrode 30 is typically aluminum, 1½ microns thick, 50 microns wide, and 320 microns long. The spacing between adjacent edges of electrodes 28 and 30 and between 30 and 32 is 40 microns in both cases. Cathode region 24 is of n+ type conductivity and is typically 1½ microns thick, 33 microns wide, 99 microns long, and has an impurity concentration of approximately $5 \times 10^{19}$ impurities/cm$^3$. Guard ring region 40, which surrounds cathode region 24, is of p+ type conductivity and is 2 microns deep, has an inner diameter along surface 11 of approximately 45 microns and an outer diameter of approximately 71 microns, and an impurity concentration of approximately $10^{19}$ impurities/cm$^3$. The spacing between guard ring 40 and cathode region 24 is approximately 6 microns. Region 22 is of p type conductivity, 79 microns wide, 145 microns long, 3 to 4 microns thick, and has an impurity concentration of $10^{18}$ impurities/cm$^3$. Region 46 is of p type conductivity, is 130 microns wide at the outer periphery, approximately 9 microns wide at the inner periphery (the distance between the sidewalls of region 46 where they intersect region 22), 195 microns long at the outer periphery, 75 microns long at the inner periphery, 15 microns deep, and has an impurity concentration of $10^{16}$ impurities/cm$^3$. Electrode 32 is typically aluminum, with a thickness of 1½ microns, a width of 114 microns, and a length of 180 microns. Region 34 is of n+ type conductivity, is 15 microns wide, 15 microns long, 1½ microns deep, and has an impurity concentration of approximately $5 \times 10^{19}$ impurities/cm$^3$. Electrode 38 is typically aluminum, with a thickness of 1½ microns, a width of 15 microns, and a length of 30 microns. The distance between the edge of region 42 and the edge of semiconductor body 16 is typically 42 microns. The distance between the edge of region 46 and semiconductor body 16 is typically 49.5 microns.

Figure 2:
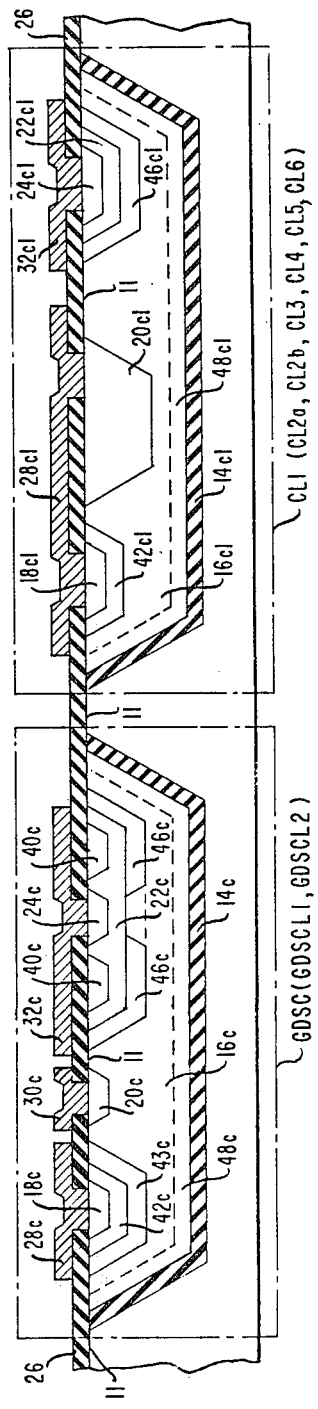
FIG. 2 illustrates two separate additional solid-state structures formed on the semiconductor body (substrate) of FIG. 1.

Referring now to FIG. 2, there is illustrated another portion of semiconductor support member 12 comprising a gated diode switch GDSC (GDSCL1, GDSCL2) and a pinch resistor CL1(CL2a, CL2b, CL3, CL4, CL5, CL6) are illustrated within separate dashed line rectangles. GDSC (GDSCL1, GDSCL2) is essentially identical to GDS1 (GDS3) and GDS2 (GDS4) except it is not illustrated connected to another gated diode switch. CL1(CL2a, CL2b, CL3, CL4, CL5, CL6) is separated from 12 by a dielectric layer 14cl and comprises a semiconductor body 16cl whose bulk is of p− type conductivity. A p+ type conductivity contact region 18cl and separated n+ type conductivity regions 20cl and 24cl exist within body 16cl. A p type conductivity region 42cl encircles region 18cl and is separated from region 20cl by a portion of the bulk of body 16cl. Regions 18cl and 42cl can directly contact region 20cl. A p+ type conductivity region 22cl encircles region 24cl and itself is encircled by a p type conductivity type region 46cl. Region 46cl is separated from region 20cl by a portion of the bulk of body 16cl. An aluminum electrode 28cl makes electrical contact to regions 18cl and 20cl. Another aluminum electrode 32cl makes electrical contact to region 24cl. Apertured dielectric layer 26 isolates electrodes 28cl and 32cl from portions of surface 11 except where it is desired to make low resistance contact.

CL1(CL2a, CL2b, CL3, CL4, CL5, CL6) acts essentially as a pinch resistor with region 20cl pinching off semiconductor body 16cl to create a relatively high resistance region between the bottom of region 20cl and the top of dielectric layer 14. CL1(CL2a, CL2b, CL3, CL4, CL5, CL6) acts to limit current flow between regions 18cl and 24cl. Within a first range of potential difference between regions 18cl and 24cl, the resistance between the two regions is essentially constant and the current increases linearly with voltage. Once this range is exceeded, the electrical field created under electrode 28cl tends to effectively further pinch off the portion of semiconductor body 16cl under region 20cl. This increases the resistance between regions 18cl and 24cl and thus limits current flow from one region to the other as voltage across the regions increases. CL thus acts as a resistor and as a current limiter.

The previously discussed fabricated embodiment of structure 10 also includes a plurality of current limiters (CL). Body 16cl, regions 18cl, 42cl, 24cl, 22cl, and 46cl are of p type conductivity, and layer 48cl and region 20cl are of n type conductivity. Dielectric layer 14cl is silicon dioxide as is layer 14 of FIG. 1. Electrodes 18cl and 32cl are of aluminum as are all electrodes of GDS1 (GDS3) of FIG. 1. The actual geometry of the regions of CL is a function of the desired current limiting required.

Referring now to FIG. 3, there is illustrated a switching system 300 comprising control circuitry 310 (contained within the large dashed line rectangle) and two pairs of high voltage capability switches GDS1, GDS2 and GDS3, GDS4. Control circuitry 310 comprises a gated diode switch GDSC, a first branch circuit 310A (illustrated within a dashed line rectangle), a second branch circuit 310B (illustrated within a dashed line rectangle), diodes D4 and D5, and current limiter circuits CL2a and CL2b.

A first output terminal G0 is coupled to the gates of GDS1 and GDS2, the cathode of D4, and to a first terminal of CL2a. A second output terminal G1 is coupled to the gates of GDS3 and GDS4, the cathode of D5, and to a second terminal of CL2b. The anode of GDS1 and the cathode of GDS2 are coupled to a first terminal X0 and to a resistor R5. R5 is also coupled to a power (potential) source −V5 and to a terminal 352. The cathode of GDS1 and the anode of GDS2 are coupled to a second terminal Y0 and to a resistor R6. R6 is also coupled to a power (potential) source −V6 and to a terminal 354. The anode of GDS3 and the cathode of GDS4 are coupled to a third terminal X1 and to a resistor R7. R7 is also coupled to a power (potential) source −V7 and to a terminal 356. The cathode of GDS3 and the anode GDS4 are coupled to a fourth terminal Y1 and to a resistor R8. R8 is also coupled to a power (potential) source −V8 and to a terminal 358.

The combination of GDS1 and GDS2 functions as a first bidirectional switch which selectively couples terminals X0 and Y0 via a relatively low resistance path through GDS1 or GDS2. The combination of GDS3 and GDS4 serves as a second bidirectional switch which selectively couples terminals X1 and Y1 via a relatively low resistance path through GDS3 or GDS4. For illustrative purposes these switches are assumed to comprise the interconnected gated diode switches illustrated in FIG. 1. Control circuitry 310 also comprises switches GDSC, GDSCL1, and GDSCL2. These switches are assumed to have the structure of FIG. 2 (illustrated within the dashed line rectangle denoted as GDSC (GDSCL1, GDSCL2)). Control circuitry 310 uses seven current limiter circuits CL1, CL2a, CL2b, CL3, CL4, CL5, and CL6. For illustrative purposes these current limiters are assumed to each be like the portion of the structure of FIG. 2 (illustrated within the dashed line rectangle and denoted as CL1(CLa, CL2b, CL3, CL4, CL5, CL6). Control circuitry 310 functions so as to supply the needed potentials at terminals G0 and G1 and the current sourcing capability necessary to control the state of GDS1, GDS2, GDS3, and GDS4.

An input terminal 312 is coupled to one terminal of a resistor R1 of branch circuit 310A. An output terminal 326 of 310A is coupled to the gate of GDSC, the cathode of a p-n junction diode D3 of 310A, and to a first terminal of CL3 of 310A. 310A serves to control the state of GDSC by controlling the potential of the gate of GDSC and by having the capability of sourcing current (providing positive current flow) into the gate of GDSC. 310A comprises p-n junction diodes D1, D2, and D3, n-p-n transistor T1, current limiters CL1, CL2, and CL3, and a resistor R1. A second terminal of R1 is coupled to the base of T1 and to a terminal 314. The collector of T1 is coupled to the cathode of D2 and to a terminal 316. The emitter of T1 is coupled to the anode of D1 and to a terminal 318. The anodes of D2 and D3 and one terminal of CL1 are coupled to a terminal 322. A second terminal of CL1 is coupled to power (potential) source +V1 and to a terminal 324. The cathode of D1 is coupled to potential source VSS and to a terminal 320. A second terminal of CL3 is coupled to a power (potential) source −V4 and to a terminal 328. CL3 is optional.

Circuit branch 310B comprises two gated diode switches GDSCL1 and GDSCL2, two zener diodes Z1 and Z2, current limiter circuits CL4, CL5, and CL6, and resistors R2, R3 and R4. First terminals of CL4 and CL6 and the cathode of GDSCL2 are coupled to a terminal 334. A second terminal of CL4 is coupled to the cathode of GDSCL1, the gate of GDSCL2, and to a terminal 336. The gate of GDSCL1 is coupled to one terminal of CL5, the collector of T2, and to a terminal 344. The anode of GDSCL1 is coupled to the anode of Z1 and to a terminal 338. The cathode of Z1 is coupled to a second terminal of CL5, a first terminal of R2, a first terminal of R3, a second terminal of CL6, and to a terminal 340. A second terminal of R2 is coupled to a power source +V2 and to a terminal 342. A second terminal of R3 is coupled to the cathode of Z2 and to a terminal 346. The anode of Z2 is coupled to the base of T2, a first terminal of R4, and to a terminal 348. The emitter of T2 is coupled to a second terminal of R4, the anode of GDSCL2, and a terminal 350.

The cathode of GDSC is coupled to the anodes of D4 and D5 and to a terminal 330. Terminal 330 can be directly connected to terminal G0 if GDS3 and GDS4 are not needed. In this case D4 and D5 are both eliminated. In another embodiment a second GDSC is used with its anode coupled to the anode of the first GDSC and its gate coupled to the gate of the first GDSC. In this embodiment D4 and D5 are eliminated and the cathode of the first GDSC is connected directly to G0 and the cathode of the second GDSC is connected directly to G1.

The basic operation of switching system 300 is as follows:

Assuming that the anodes of GDS1 and GDS3 are at +220 volts and the cathodes of GDS2 and GDS4 are at −220 volts. Conduction between terminals X0 and Y0 and between terminals X1 and Y1 occurs if the potentials of terminals G0 and G1 are at +220 volts or less positive. Conduction can occur until the potentials of the gates of GDS1, GDS2, GDS3, and GDS4 reach a positive enough value to essentially completely pinch off the semiconductor body 16 of each GDS between the anode and cathode region thereof. For the GDS illustrated in FIGS. 1 and 2, this potential is about 20 volts above the anode potential, or in this case, +240 volts.

With $+V1=+337$ volts, $+V2=312$ volts, $VSS=+260$ volts, $-V3=0$ volts, $-V4=-200$ volts, $-V5=-V6=-V7=-V8=-48$ volts, and current limiters CL1, CL2a, CL2b, CL3, CL4, CL5, and CL6 limiting current therethrough to 70, 6, 6, 6, 6, 6, and 70 microamperes, respectively, resistors R1, R2, R3, R4, R5, R6, R7, and $R8=20\times10^3$, $2\times10^3$, $1\times10^3$, $1\times10^3$, $1\times10^6$, $1\times10^6$, $1\times10^6$, and $1\times10^6$, ohms, respectively, and the breakdown voltage of Z1 and $Z2=35$ and 70 volts, respectively, circuitry 310 is capable of providing the needed potentials and source of current to control the states of GDS1, GDS2, GDS3, and GDS4.

Branch circuit 310A serves to set the potential of terminal 326 (the gate of GDSC) so as to control the state of GDSC. A low level input voltage signal, a "0" (typically +260 volts), applied to input terminal 312 biases T1 off and facilitates a flow of current from +V1 through CL1, D3, CL3, and into −V3. CL1 and CL3 are selected such that the voltage appearing at terminal 326 with T1 biased off is at a level which is significantly more positive than the potential level of +V2. CL3 is optional and can be eliminated. In such case, D3 conducts in the forward direction until terminal 326 reaches a potential level within several tenths of a volt of +V1. This potential on the gate of GDSC biases GDSC to the OFF state and thus isolates terminal 330 from +V2. Terminal 330 floats in potential at a level no more positive than one p-n junction drop below the potential of terminal X0 or Y0, whichever is more positive in potential. Terminal G0 assumes a potential level close to that of X0 as the gate-to-anode junction of GDS1 becomes forward-biased. Terminal G1 assumes a potential close to that of X1 as the anode-to-gate junction of GDS3 becomes forward-biased. These conditions bias GDS1 and GDS3 ON and conduction between terminals X0 and Y0 and between terminals X1 and Y1 occurs.

If GDSC had been in the ON state (conducting) prior to the application of the "0" input level to terminal 312, then positive current flows from +V1, through D1, and into the gate of GDSC. CL1 is selected to allow a greater current flow therethrough than through CL2 to insure that sufficient positive current is available to flow into the gate of GDSC so as to cut off conduction between the anode and cathode thereof. With GDSC on and conducting, GDS1, GDS2, GDS3, and GDS4 are normally in an OFF state. Only a relatively modest amount of positive current must flow into the gate of GDSC to cut off conduction therethrough since the conduction through GDSC is relatively small. It is thus not necessary to use a high current and high voltage device to provide the needed current sourcing function necessary to cause GDSC to assume the OFF state. 310A has only modest current sourcing capability and accordingly can only cause GDSC to switch off if the current flow through GDSC is relatively low. Branch circuit 310B serves to selectively maintain the current through GDSC at a level which is within a range that is low enough for 310A to switch GDSC off.

The potential of terminal 312 is raised to a high level, a "1" (typically +265 volts), to cause GDSC to switch to the ON state and thus cause GDS1, GDS2, GDS3, and GDS4 to switch to the OFF (blocking) state.

An input "1" voltage signal, typically +265 volts, biases T1 ON and allows T1 to operate in saturation. The potential of terminal 322 is pulled down to approximately +261.7 volts (assuming a VCE(SAT) of 0.3 volts for T1 and voltage drops across D1 and D2 of 0.7 volts each). Without CL3 present, terminal 326 is pulled to a value close to that of the anode (334) of GDSC. The potential of terminal 326 cannot drop below one diode voltage drop below the potential of the anode of GDSC because a junction diode comprising the anode and gate of GDSC becomes forward-biased and pulls up the potential of terminal 326. With CL3 present, terminal 326 is rapidly and actively held at a value close to one diode drop below the potential of the anode of GDSC. In either case, this switches GDSC to the ON state and causes the potential of terminal 330 to be approximately 2 volts less than the potential of the anode of GDSC (terminal 334). The voltage drop from terminal 342 to 334 is designed such that with GDSC ON, the potential of terminal 330 is more positive than that of the anode of GDS1, GDS2, GDS3, or GDS4 by a sufficient amount to switch all these GDSs to the OFF (blocking) state. In addition, there is a sufficient positive current flow from 310B and through GDSC and into the gates of these GDSs (GDS1, GDS2, GDS3, GDS4) to switch any of these ON GDSs to the OFF state. Once any of these GDSs is switched off the current flow into the gate thereof ceases. The geometry and impurity concentrations of these GDSs determine exactly how much more of a positive potential must exist at the gate relative to the anode and cathode to turn it off.

Minority carriers emitted at the cathode of one of these GDSs (GDS1, GDS2, GDS3, GDS4) and collected by the gate constitute the equivalent of positive current flow from +V2 through 310B, GDSC, and into the gate of GDS1, GDS2, GDS3, and/or GDS4. This current flow can be substantial and as a result it is necessary to have a high voltage and current device such as GDSC to switch these GDSs to the OFF state. The high cost of a high voltage and high current transistor limits its application in this control circuit.

Branch circuit 310B operates as follows:

With GDSC biased OFF there is no current flow through 310B from +V2 to terminal 334. With GDSC biased ON, conduction from +V2, through CL6, anode-cathode of GDSC, D4, D5, CL2a, CL2b, and into −V4 occurs. If GDS1, GDS2, GDS3, and GDS4 are all OFF at this time there is no current flow into the gates of GDS1, GDS2, GDS3, and GDS4 except for leakage current. If GDS1 is ON and conducting, then current flows into its gate in an attempt to switch GDS1 to an OFF state and to thus break conduction between terminals X0 and Y0. The amount of current needed to cause GDS1 to switch OFF may be relatively large. As the current through CL6 increases towards the maximum limit established by CL6, the potential of terminal 334 decreases relative to terminal 340. As soon as the potential difference between terminals 334 and 340 exceeds the breakdown voltage of Z2, a current path from terminal 340 through R3, Z2, R4, and the anode-cathode of GDSCL2 is established. This causes T2 to be biased ON and to conduct and to pull the potential of terminal 344 (the gate of GDSCL1) down to a level at which GDSCL1 is switched ON and establishes a third current path from terminal 340, through Z1, the anode-cathode of GDSCL1, CL4 the gate-cathode of GDSCL2 and then into terminal 334. The total current flow from terminal 340 to terminal 334, through GDSC, D4, and into the gate of GDS1 (terminal G0) is designed to be of a sufficiently high level to cause GDS1 to be switched OFF and to cease conducting. As GDSCL1 begins to conduct the potential of 336 rises towards +V2 and current flows into the gate of GDSCL2. This causes GDSCL2 to be switched OFF. This in turn causes T2 to be switched OFF, which in turn allows terminal 344 to rise in potential. A flow of current into the gate of GDSCL1 through CL5 and the increase in the potential of 344 switches GDSCL1 OFF and conduction therethrough ceases. Thus conduction through GDSCL2 establishes conduction through GDSCL1 which subsequently cuts off conduction through GDSCL2. This in turn cuts off conduction through GDSCL1. The gate (336) of GDSCL2 is left at a potential close to the cathode (terminal 334) and thus GDSCL2 can again begin to conduct if Z2 operates in a avalanche breakdown.

If GDS1 does not switch OFF the potential of terminal 334 remains sufficiently different from that of 340 such that Z2 operates in avalanche breakdown and GDSCL1 again conducts and the process is repeated. This process automatically repeats until GDS1 is switched OFF. Thus 310B acts as a current pulse generator with each pulse of current trying to beak conduction through GDS1. The repetition rate of the current pulses is essentially a function of the resistances and parasitic capacitances of branch circuit 310B.

In many telephone switching applications GDS1, GDS2, GDS3 and GDS4 operate with only 48 volts between anode and cathode when in the OFF state; however, it is possible that ±220 volts exists at the anode and/or cathode due to ringing, testing, coin telephone controlling, and induced 60 Hz voltages and, accordingly, control circuit 310 is designed to block these high voltages.

The embodiments described herein are intended to be illustrative of the general principles of the present invention. Various modifications are possible consistent with the spirit of the invention. The junction transistors could be replaced by field effect transistors provided the polarities and magnitudes of the power supplies and circuit configurations are appropriately modified as is well known in the art. Still further, R1, R2, R3, and R4 can be standard integrated circuit resistors or pinch resistors. Still further, the current limiters can be a variety of different types of resistors or junction field effect transistors. Still further, the branch circuit 310A can be replaced by a variety of circuits including the circuitry within dashed line rectangle B illustrated in FIG. 3 of U.S. patent application Ser. No. 972,023, filed Dec. 20, 1978. Still further, D1 and R1 can be switched in position such that the anode of D1 is coupled to terminal 312 and one terminal of R1 is coupled to terminal 318.

We claim:

1. Circuitry for use with a first switching device (GDS1) of the type comprising a semiconductor body (16) a bulk portion of which is of a relatively high resistivity, a first region (18) of a first conductivity type and of a relatively low resistivity, a second region (24) of a second conductivity type opposite that of the first conductivity type, the first (18) and second (24) regions being connected to output terminals of the switching device, a gate region (20) of the second conductivity type, the gate region (20) being coupled to a control terminal of the switching device (GDS1), the first (18), second (24) and gate (20) regions being mutually separated by portions of the bulk of semiconductor body (16), the parameters of the device (GDS1) being such that, with a first voltage applied to the control terminal of the first switching device (GDS1), a potential is established within a cross-sectional portion of the bulk of the semiconductor body (16) which is substantially different from that of the potential of the first (18) and second (24) regions and which prevents current flow between the first (18) and second (24) regions, and that, with a second voltage applied to the control terminal of the first switching device (GDS1) and with appropriate voltages applied to the output terminals (X0, Y0) of the first switching device (GDS1), a relatively low resistance current path is established between the first (18) and second (24) regions by dual carrier injection, a second switching device (GDSC) of the same type as said first switching device, a second output terminal (330) of the second switching device (GDSC) being coupled to the control terminal of the first switching device (GDS1), a first branch circuit (310A) coupled to the second switching device (GDSC) for controlling conduction between the first (18) and second (24) regions thereof, Characterized by a second branch circuit (310B) coupled to the second switching device (GDSC) and being adapted to be coupled to a second potential source (+V2);

the second branch circuit (310B) being adapted to supply up to a preselected maximum current level to the second switching device (GDSC) to facilitate the switching of the first switching device (GDS1) from an ON state to an OFF state and then thereafter to reduce the current level to a lower level and then to repeatedly and automatically increase and decrease the current flowing therethrough until the first switching device is set to the OFF state.

2. The circuitry of claim 1 further characterized by:
the second circuit branch (310B) comprises third (GDSCL1) and fourth (GDSCL2) switching devices of the same type as the first switching device (GDS1) with the gate of the fourth device (GDSCL2) coupled to the cathode of the third device (GDSCL1) and the gate of the third device (GDSCL1) coupled to the anode of the fourth device (GDSCL2) such that if conduction between the anode and cathode of the fourth device (GDSCL2) reaches a preselected level, conduction through the third device (GDSCL1) is established which subsequently cuts off conduction through the fourth device (GDSCL2) which in turn subsequently cuts off conduction through the third device (GDSL1).

3. The circuitry of claim 2 further characterized by:
first (CL4), second (CL5), and third current limiter circuits (CL6);
first (Z1) and second (Z2) zener diodes;
first (R2), second (R3), and third (R4) resistors;
an n-p-n transistor T2;
the cathode of Z1 is coupled to R2, R3, CL5, CL6, and a first circuit terminal (340);

the anode of Z1 is coupled to the anode of GDSCL1 and to a second circuit terminal (338);

the gate of GDSCL1 is coupled to a second terminal of CL5, to the collector of T2, and to a third circuit terminal (344);

the cathode of GDSCL1 is coupled to one terminal of CL4, the gate of GDSCL2, and to a fourth circuit terminal (336);

the cathode of GDSCL2 is coupled to the second terminals of CL4 and CL6, the anode of GDSC, and to a fifth circuit terminal (334);

the anode of GDSCL2 is coupled to the emitter of T2, a first terminal of R4, and to a sixth circuit terminal (350);

the base of T2 is coupled to the anode of Z2, a second terminal of R4, and to a seventh circuit terminal (348);

the cathode of Z2 is coupled to a second terminal of R3, and to an eighth circuit terminal (346); and a second terminal of R2 is adapted to be coupled to a second potential source (+V2).

* * * * *